United States Patent [19]
Tanaka

[11] Patent Number: 5,499,100
[45] Date of Patent: Mar. 12, 1996

[54] PHOTO-LITHOGRAPHY APPARATUS AND METHOD OF CORRECTING OFF-TELECENTRICITY OF THE APPARATUS CAUSED BY SHIFT OF EFFECTIVE ILLUMINATION SOURCE

[75] Inventor: Hiroyuki Tanaka, Kawasaki, Japan

[73] Assignee: Fujitsu Limited, Kawasaki, Japan

[21] Appl. No.: 350,172

[22] Filed: Nov. 30, 1994

[30] Foreign Application Priority Data

Mar. 15, 1994 [JP] Japan ..................................... 6-043566

[51] Int. Cl.⁶ .................................................. G01B 11/00
[52] U.S. Cl. ............................ 356/401; 355/53; 250/548
[58] Field of Search ..................................... 356/399, 400, 356/401, 122, 363; 355/53; 250/548

[56] References Cited

U.S. PATENT DOCUMENTS

| | | | |
|---|---|---|---|
| 5,414,519 | 5/1995 | Han .......................................... | 356/401 |
| 5,420,417 | 5/1995 | Shiraishi .................................. | 356/121 |

OTHER PUBLICATIONS

"Overlay and Lens Distortion in a Modified Illumination Stepper", Lee et al, Proc. SPIE, vol. 2197, Mar. 1994, pp. 2–8.

*Primary Examiner*—Frank Gonzalez
*Assistant Examiner*—Robert Kim
*Attorney, Agent, or Firm*—Nikaido, Marmelstein, Murray & Oram

[57] ABSTRACT

A photo-lithography apparatus comprising an effective illumination source, a condenser lens, a reticle, a projection lens, and an XYZ stage, wherein a reduced image of pattern on the reticle is formed on a substrate disposed on the XYZ stage, and wherein the effective illumination source comprises an aperture stop which is mechanically changeable depending on an illumination mode, the apparatus of the invention characterized further comprising: a photo-detector disposed on the XYZ stage for detecting an image of a specific pattern; a drive mechanism for moving the effective illumination source in X, Y, and Z axis-directions; and circuitry for detecting an off-telecentricity amount of the photo-lithography apparatus and outputting adjustment data to the drive mechanism for moving the effective illumination source, wherein the detecting/outputting circuitry is coupled with the photo-detector, the XYZ stage, and the drive mechanism for moving the effective illumination source, thereby misalignment of the effective illumination source causing the off-telecentricity being corrected.

13 Claims, 7 Drawing Sheets

PHOTO-LITHOGRAPHY APPARATUS AND METHOD OF CORRECTING OFF-TELECENTRICITY OF THE APPARATUS CAUSED BY SHIFT OF EFFECTIVE ILLUMINATION SOURCE

BACKGROUND OF THE INVENTION

1. Field of the Invention

The present invention relates to a photo-lithography apparatus used for fabricating LSI devices of high integration density, and more particularly to a photo-lithography apparatus comprising a system for automatically detecting and correcting off-telecentricity of the photo-lithography apparatus and a method for using the same.

2. Description of the Related Art

A photo-lithography apparatus plays an important role in mass production of LSI devices. At present, semiconductor devices having about half-micron patterns can be produced using the photo-lithography apparatus (stepper) using i-line illumination (365 nm wavelength light from mercury lamp) and magnification factor of 5:1.

In order to further improve resolution toward fabrication of sub-half-micron devices, new photo-lithography technologies are under investigation, among which phase shift mask and modified illumination (oblique illumination) technologies play important roles. These two technologies utilize 180° phase difference between the lights passing through closely adjacent slits. In the prior art, an effective illumination source uses only one aperture stop, however, the above new technologies require different aperture stops depending on an illumination mode. In using the phase shift mask, the effective illumination source requires an aperture stop having an opening of a smaller diameter than that of the conventional aperture stop. On the contrary, the oblique illumination mode needs an aperture stop which prevents transmission of light at the central portion of the aperture stop, in other words, an aperture stop which has an annular opening or four openings arranged symmetrically with respect to the center of the aperture stop.

In manufacturing LSI or ULSI devices, each semiconductor device needs a lot of mask processes till the end of fabrication, and each mask process needs different precision in photo-lithography. Therefore, the aperture stop is changed frequently depending on the mask (reticle) to be illuminated. Usually, a plurality of aperture stops are arranged on a disk and a single aperture stop is selected by rotation of the disk in the photo-lithography apparatus.

The change of the aperture stop as described above, together with the reticle change, introduces a minor shift in an axial direction or in a lateral (transversal) direction of an optical system of the photo-lithography apparatus. An ideal optical system of photo-lithography apparatus is often called an optically telecentric system. The "telecentric" means that light passing through an image plane of the optical system in the apparatus is parallel to an optical axis (Z-axis), therefore, coordinates in xy plane for a focused pattern are constant when z coordinate is changed within a depth of focus, and magnification (in this case, reduction) is also constant within a depth of focus. The change of aperture stops is liable to make the optical system of the photo-lithography apparatus off-telecentric.

Before describing the existing method of detecting and correcting off-telecentricity of photo-lithography apparatus, an outline of the photo-lithography apparatus is first described. FIG. 1 is a schematic diagram of the existing photo-lithography apparatus. An illumination system comprises an effective illumination source 1 and a condenser lens 2. The effective illumination source 1 further comprises a mercury lamp 21, an input lens 22, a flyeye lens 23, and an aperture stop disk 24. UV light radiated from the mercury lamp 21 is refracted by the input lens 22 to the parallel light in passing therethrough, and the light is next input to the flyeye lens 23. The flyeye lens 23 is composed of a plurality of square cross-sectional rod lenses, and has a function of modifying the input light of non-uniform intensity distribution to the light of substantially uniform intensity distribution at an object plane (reticle 6) and an image plane (substrate 7).

A top view of the aperture stop disk 24 is shown in FIG. 2. The aperture stop disk 24 comprises, for example, five aperture stops 24a through 24e. Three aperture stops 24a, 24b, and 24c have circular holes of different diameters, aperture stop 24d has an annular opening, and aperture stop 24e has four holes symmetrically arranged. The aperture stops 24d, 24e are used for the oblique illumination mode.

In FIG. 1, the light passing through the selected one of aperture stops 24 is focused by the condenser lens 2 and illuminates reticle 6 on which patterns of a chromium layer are formed. The shaped light with the reticle patterns further passes through a projection lens 3 and is focused on a substrate 7 disposed on an XYZ stage 4. The XYZ stage 4 is movable in each of X, Y, and Z axis-directions by a drive mechanism 10, and a position of the XYZ stage can be precisely measured by a laser interference meter 11 and precise position data of coordinates (x, y, z) can be obtained.

In order to obtain an off-telecentricity amount, a reticle 6 having specific patterns formed thereon is used. The specific patterns on the reticle are composed or a main pattern of a square shape and an auxiliary pattern of a square-shaped slit pattern, and these patterns may be separated, but separation distances between two patterns should be known precisely. The reticle 6 is mounted on a support 28 and movable in X and Y axis-directions by a drive mechanism 29.

In FIG. 3, a semiconductor wafer 7 with a resist layer formed thereon is disposed on the XYZ stage 4, and the XYZ stage is moved such that a reduced image 26 of the main pattern is focused at the center of the wafer 7 as shown in FIG. 3, and the resist on the wafer 7 is once exposed. Next, the XYZ stage 4 is moved by the drive mechanism 10 in the Z axis-direction (axial direction) by $\Delta z$ within the depth of focus, and the reticle 6 is moved by the drive mechanism 29 in the X and Y axis-directions by the known separation distances such that the center of the auxiliary pattern image 27 is theoretically coincident with the center of the main pattern image 26. However, in actual case, the center of the auxiliary pattern image 27 is slightly shifted from that of the main pattern image 26 as shown in FIG. 3. The resist layer on the wafer is again exposed under these conditions.

The wafer is taken out from the photo-lithography apparatus, and the resist layer on the wafer 7 is developed. In FIG. 4, the resist layer having main pattern 26 and auxiliary pattern 27 is formed on the wafer. Coordinates of $X_1$, $X_2$; and $Y_1$, $Y_2$ for the main pattern 26, and coordinates of side positions $X_3$, $X_4$; and $Y_3$, $Y_4$ for the auxiliary pattern 27 are precisely measured.

When shift distances of the center of the auxiliary pattern 27 in the X and Y axis-directions from the center of the main pattern 26 are expressed as $\Delta X$ and $\Delta Y$, then the following results are obtained.

$$[(X_4-X_3)-(X_2-X_1)]\times\tfrac{1}{2}=\Delta X$$

$$[(Y_4-Y_3)-(Y_2-Y_1)] \times \tfrac{1}{2} = \Delta Y$$

The off-telecentricity amounts of the apparatus in the X and Y axis-directions are respectively given by ratios $\Delta X/\Delta Z$ and $\Delta Y/\Delta z$.

When the off-telecentricity amounts are thus detected, the effective illumination source 1 is manually adjusted in the X and Y axis-directions corresponding to the detected off-telecentricity amounts.

The off-telecentricity described above is mainly caused by a shift of the effective illumination source in the X and Y axis-directions (for convenience, this called illumination off-telecentricity).

When a shift of the effective illumination source occurs in the Z axis-direction (for convenience, this is called magnification off-telecentricity), this causes a change in magnification when a wafer position moves in the Z axis-direction. To detect an amount of the magnification off-telecentricity, the similar method can be applied, but the details thereof are omitted.

SUMMARY OF THE INVENTION

It is a general object of the invention to provide a photo-lithography apparatus which can detect and correct a shift of an optical axis of the apparatus, thereby eliminating processes such as preparing a wafer with photo-resist layer thereon, and exposing and developing the resist layer.

It is another object of the invention to provide a photo-lithography apparatus which saves man-hours required for the complicated work of detecting off-telecentricity and correcting the same.

It is further object of the invention to provide the photo-lithography apparatus which automatically performs processes for detecting and correcting off-telecentricity.

The above objects are achieved by the photo-lithography apparatus of the present invention, wherein the apparatus comprises an effective illumination source, a condenser lens, a reticle, a projection lens, and an XYZ stage, these elements being aligned in a Z axis-direction in an XYZ-axes orthogonal coordinate system, wherein a reduced image of pattern on the reticle is formed on a substrate disposed on the XYZ stage, and wherein the effective illumination source comprises an aperture stop which is mechanically changeable depending on an illumination mode, the apparatus of the invention characterized further comprising:

a photo-detector disposed on the XYZ stage for detecting a specific pattern in the image, the photo-detector being movable in X, Y, and Z axis-directions by drive mechanism of the XYZ stage; a drive mechanism for moving the effective illumination source in X, Y, and Z axis-directions; and a circuitry for detecting an off-telecentricity amount of the photo-lithography apparatus and outputting adjustment data to the drive mechanism for moving the effective illumination source, wherein the detecting/outputting circuitry is coupled with the photo-detector, the XYZ stage, an interference meter, and the drive mechanism for the effective illumination source, thereby misalignment of the effective illumination source causing the off-telecentricity being corrected.

BRIEF DESCRIPTION OF THE DRAWINGS

Throughout the drawings, the same reference numerals designate and identify the same or similar parts.

DETAILED DESCRIPTION OF THE PREFERRED EMBODIMENTS

Figure 5:
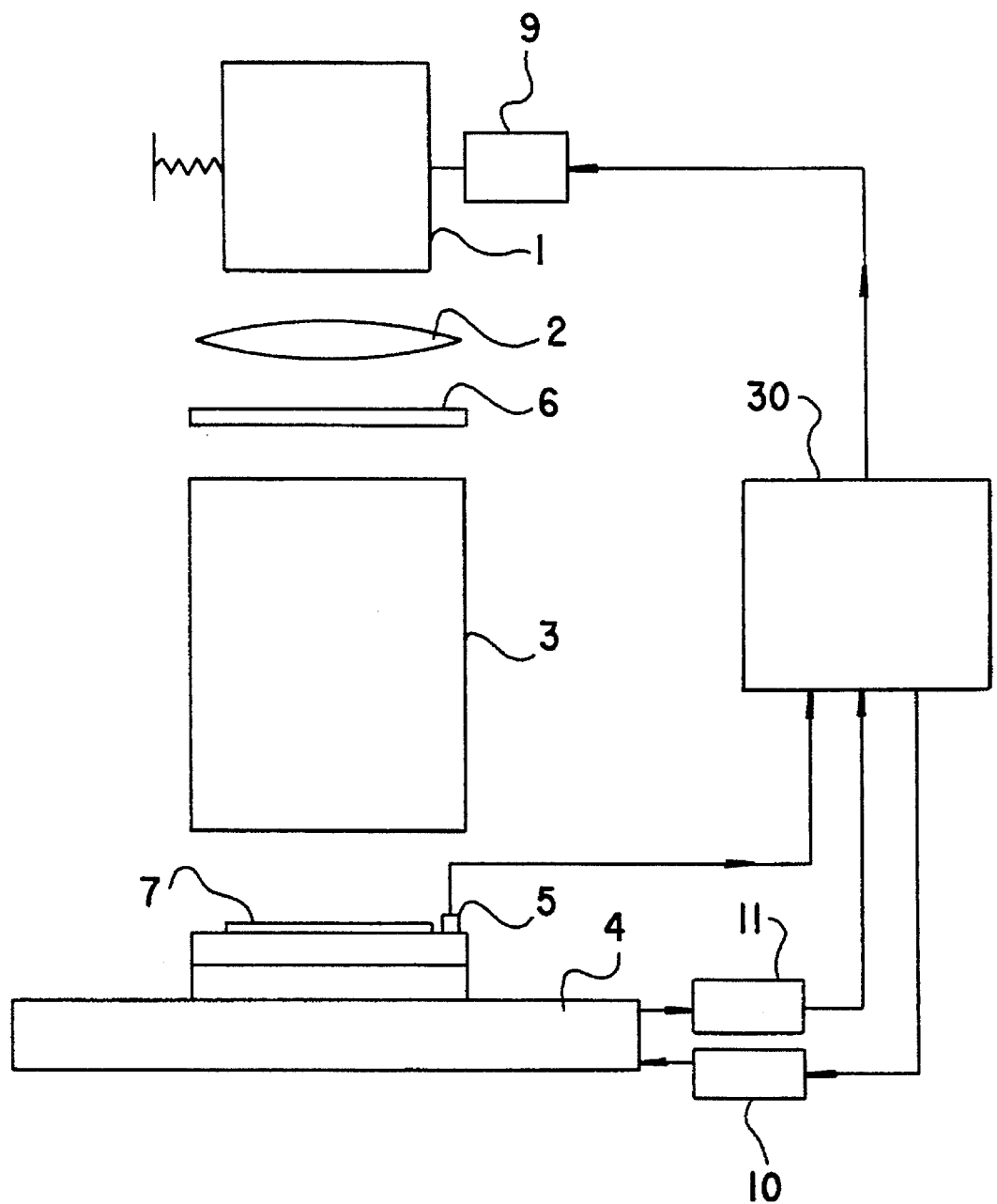
FIG. 5 is a schematic diagram of an embodied photo-lithography apparatus in accordance with the present invention for explaining basic concept of the invention.

FIG. 5 is a schematic drawing illustrating principle of an embodiment of photo-lithography apparatus according to the present invention.

Illumination light from an effective illumination source 1 is focused by a condenser lens 2 and passes through a pattern on a reticle 6. The shaped light further passes through a projection lens 3 and a reduced pattern image is formed on an XYZ stage 4.

A photo-detector 5 is fixed on the XYZ stage 4. A detecting/outputting circuitry 30 is coupled to the photo-detector 5, and a laser interference meter 11 and a drive mechanism 10 for the XYZ stage 4. The interference meter 11 and the drive mechanism 10 are substantially the same as those used in the prior art. The detecting/outputting circuitry 30 is further coupled to a drive mechanism 9 for moving an effective illumination source 1.

Figure 1:
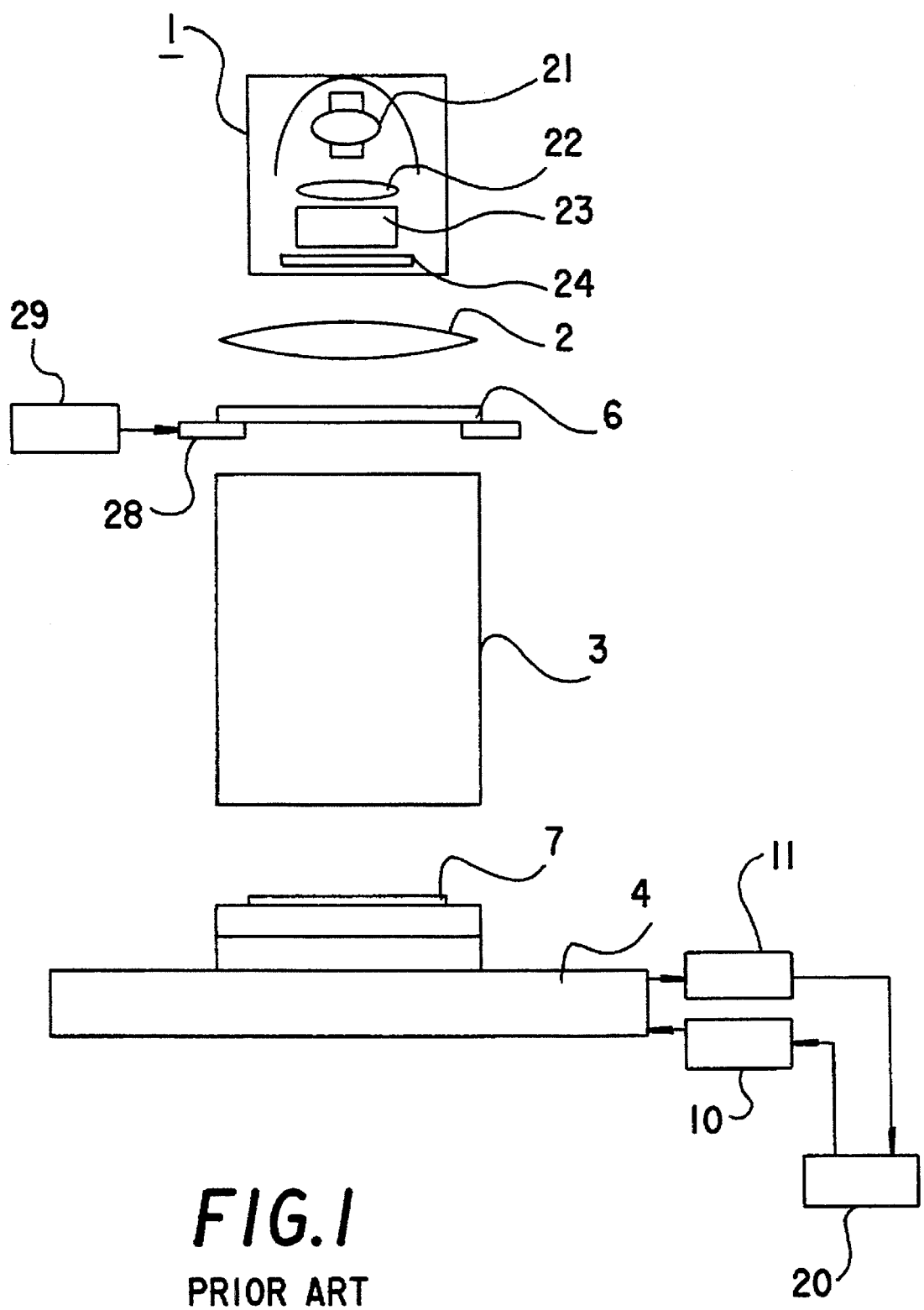
FIG. 1 is a schematic diagram of an existing photolithography apparatus.
Figure 2:
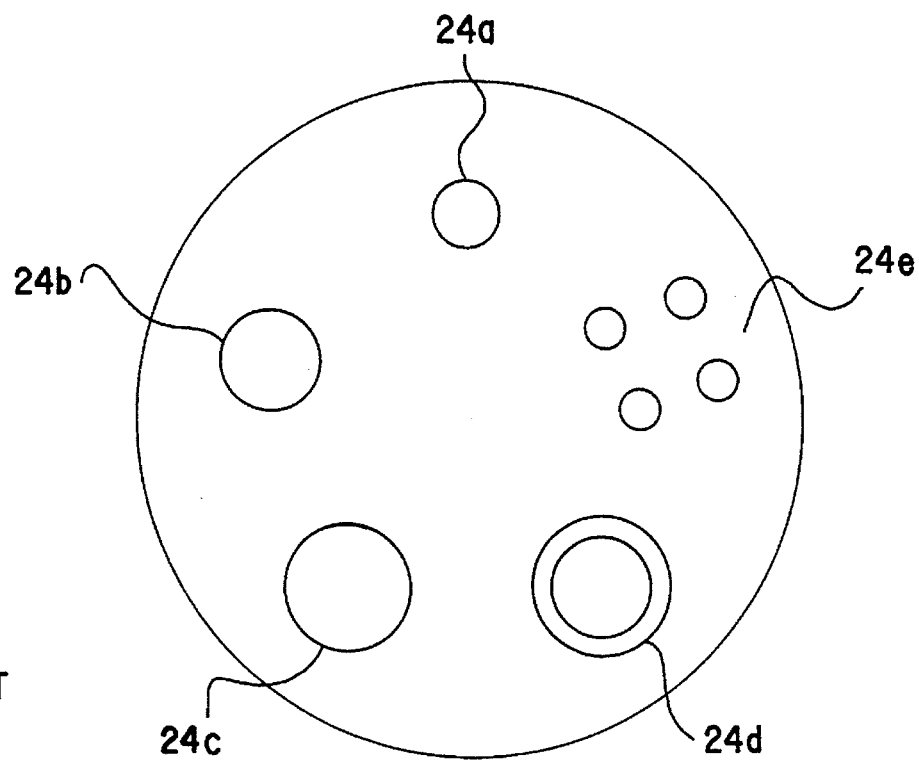
FIG. 2 is a top view of an existing aperture stop disk on which five aperture stops are formed, and one of aperture stops is selected depending on an illumination mode.
Figure 3:
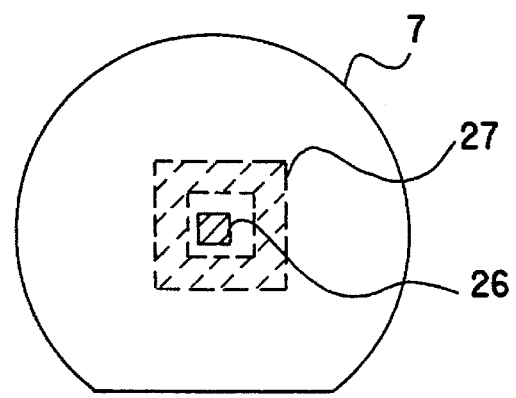
FIG. 3 shows a top view of an exposed and thereafter developed resist patterns on a wafer according in a detection method of the prior art.
Figure 4:
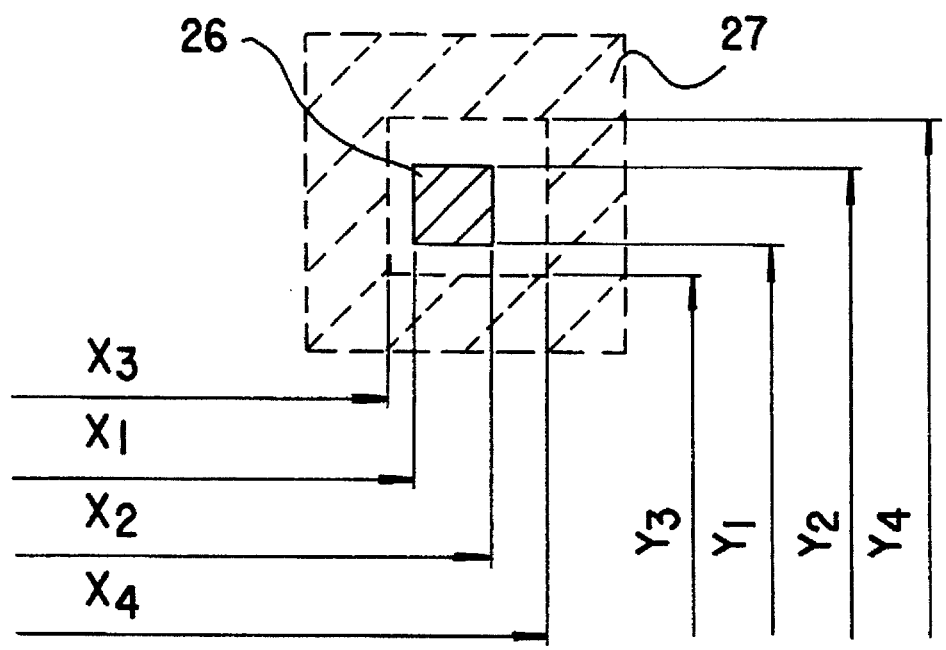
FIG. 4 is an enlarged drawing of the developed resist patterns in which measurement points for detecting a shift between two patterns are illustrated.

The effective illumination source 1 comprises a mercury lamp 21, an input lens 22, a flyeye lens 23, and a plurality of aperture stops 24 in the same way as described with reference to FIG. 1. Features of illumination light can be changed by selecting one of aperture stops 24 corresponding to an illumination mode. The drive mechanism 9 may drive the whole effective illumination source 1, however, it is enough to move three elements of the input lens 22, flyeye lens 23, and aperture stops 24 excepting the mercury lamp 21, because it has the same effect and is simple.

Figure 6:
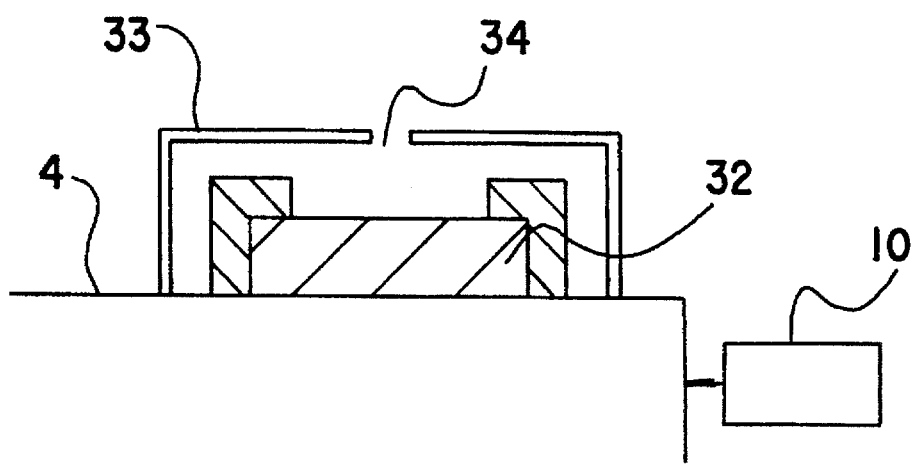
FIG. 6 is a cross sectional view of a photo-detector according to the present invention.

A cross section of the photo-detector 5 of the embodiment is shown FIG. 6. The photo-detector 5 comprises a photo-detector element 32 covered with a cover 33, and arranged on a peripheral region of the XYZ stage 4. A pinhole 34 or a slit is formed at the center of the cover 33.

Figure 7:
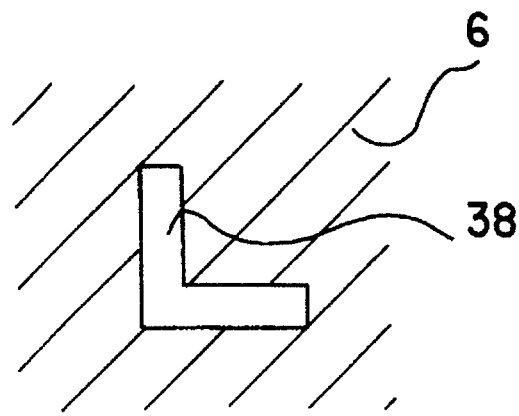
FIG. 7 shows a slit pattern on a reticle used in an embodiment of the present invention.

In detecting an off-telecentricity amount (illumination off-telecentricity) of the photo-lithography apparatus, as shown in FIG. 7, a reticle having a specific pattern 38 is used The illumination off-telecentricity caused by a shift of the effective illumination source in a transversal direction to an optical axis, in other words, in X and/or Y axis-directions, is detected by detecting an image of the reticle pattern 38 with the photo-detector 5. Herein, X, Y, and Z axes form orthogonal coordinates, and Z axis-direction defines an optical axis of the photo-lithography apparatus. The pattern 38 on the reticle is of a slit shape and has two slits, directions of which are vertical to each other. The pattern 38 is hereinafter briefly called "L"-character shaped pattern 38.

Figure 8:
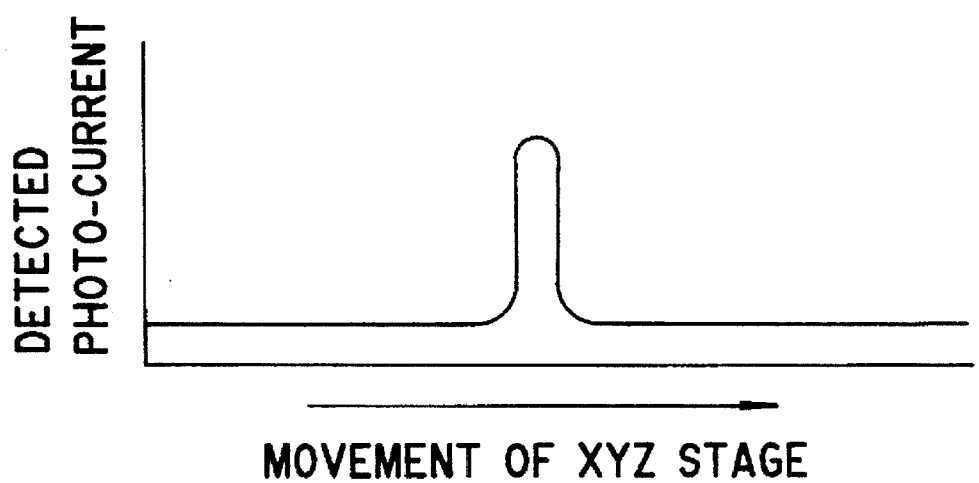
FIG. 8 is a graph showing a detected photo-current while the XYZ stage is moved.

In detecting the image of the pattern 38 formed on the reticle, the XYZ stage 4 is moved by the drive mechanism 10 in the Z axis-direction within a depth of focus. After temporary fixing the z coordinate, the XYZ stage 4 is moved, for example, in the X axis-direction such that the photo-detector 5 detects a peak of the light which has passed through the "L"-character shaped pattern and further through the pinhole 34 of the photo-detector cover 33. A detected photo-current with respect to the movement of the XYZ stage 4 is illustrated in FIG. 8. An XYZ stage position at the peak detected photo-current is measured by the interference meter 11 and the position data in X and Z axis-directions, i.e., coordinates x, z of the XYZ stage are recorded.

Next, the XYZ stage 4 is moved in the Z axis-direction (the optical axis direction) by $\Delta z$ (coordinates changes from z to z') within the depth of focus of the apparatus. It is noticeable that the slit pattern 38 of the embodiment may be comparatively a rough pattern, therefore, a large depth of focus such as 3 to 4 microns can be used for the $\Delta z$ in the test.

At coordinate z' position, the same detection process is performed by moving the XYZ stage 4 in the X axis-direction. A position of the peak detected photo-current is measured as coordinate x' by the interference meter 11. The off-telecentricity amount of the apparatus the X axis-direction is given by the following equation.

$$\Delta x/\Delta z = (x'-x)/(z'-z) \qquad (1)$$

An off-telecentricity amount in the Y axis-direction ($\Delta y/\Delta z$) can be obtained in the same way, in which the XYZ stage 4 is moved in the Y axis-direction. Coordinates y and y' can be measured at positions when a peak of the photo-detector current is detected while moving the XYZ stage in the Y axis direction.

$$\Delta y/\Delta z = (y'-y)/(z'-z) \qquad (2)$$

When the above data (1), and (2) are obtained, the detecting/outputting circuitry 30 outputs necessary adjustment data which correspond to $\Delta x/\Delta z$ and $\Delta y/\Delta z$ to the drive mechanism 9. The effective illumination source 1 is moved in the X and Y axis-directions, and the shift of the effective illumination source from the optical axis, namely illumination off-telecentricity, is compensated and corrected.

Figure 9:
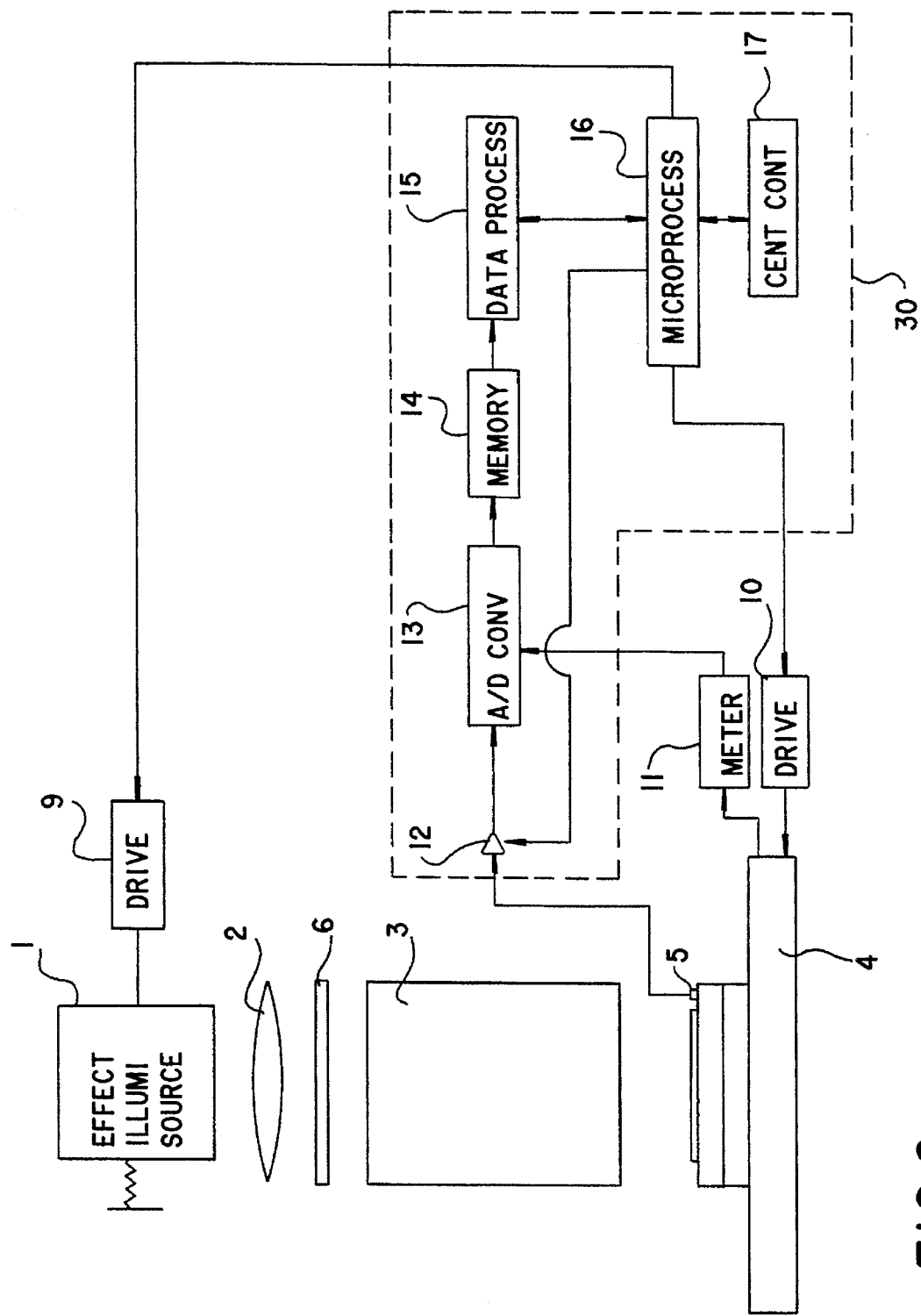
FIG. 9 is a detailed diagram of a detecting/outputting circuitry of an embodiment of the present invention.

In the above description, details of the detecting/outputting circuitry 30 are not referred to. Many circuit structures may be used for this purpose. An exemplary circuit structure is shown in FIG. 9.

An output from the photo-detector 5 is input to an automatic gain controller (AGC) 12, where the photo-current from the photo-detector 5 is amplified and an amplitude thereof is controlled at an appropriate value. The output from the AGC 12 is applied to an A/D converter 13, where the analog signal from the AGC 12 is converted to a digital signal. While moving the XYZ stage 4 with he drive mechanism 10 which is coupled to the microprocessor 16 and is under the control thereof, position data of the XYZ stage 4 are monitored and output to the A/D converter 13. When the peak value of the photo-current is detected by a comparator (not shown) while scanning the XYZ stage, position data such as coordinates x, y, z of the XYZ stage 4 are stored in a memory 14. Numerical computation is performed in a data processing unit 15 which is coupled to the memory 14 and the microprocessor 16. The microprocessor outputs adjustment data to the drive mechanism 9. All processes are performed automatically under the commands of a stored program in the microprocessor 16. A central controller 17 controls on/off for performing the detection and correction of the off-telecentricity of the photo-lithography apparatus.

The detecting/outputting circuitry 30 as described above is considered in all respects as illustrative and not restrictive, many modifications of circuitry can be considered according to the principle of the present invention.

The off-telecentricity as described above is concerned with the illumination off-telecentricity which is caused by a shift of an optical axis of the effective illumination source 1 in the X and/or axis-directions.

Next, a magnification off-telecentricity which is used by a shift of the optical axis of the effective illumination source 1 in the Z axis-direction is described.

Figure 10:
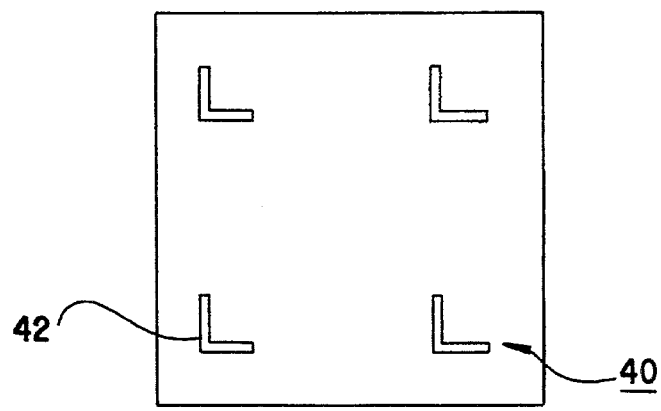
FIG. 10 shows four "L" character shaped slit patterns formed on a reticle in another embodiment for detecting magnification off-telecentricity according to the present invention.
Figure 11:
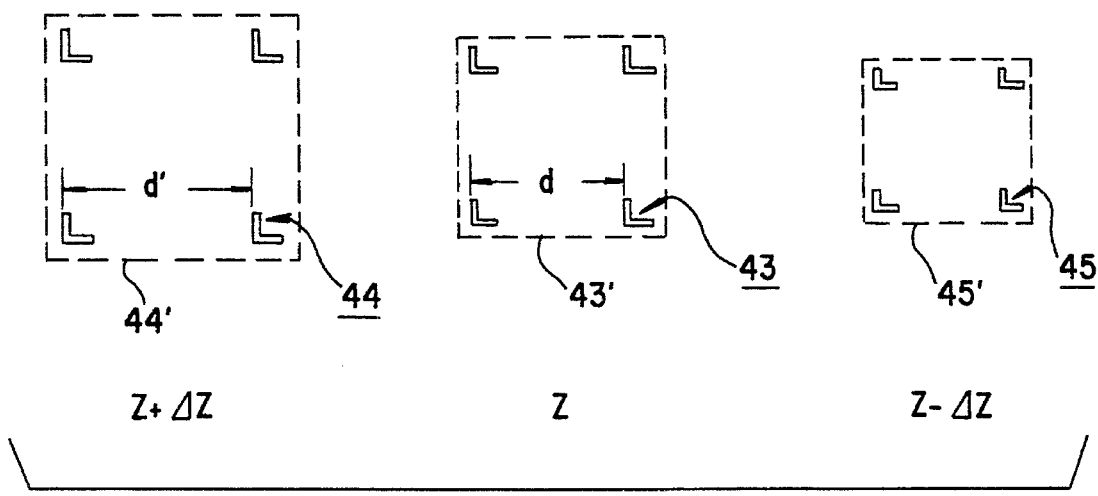
FIG. 11 illustrates image patterns for the reticle pattern shown in FIG. 10 when the XYZ stage is moved in Z axis-direction (an optical axis direction).

Pattern on the reticle 6 used for this purpose is shown in FIG. 10. The pattern 40 comprises four "L"-character shaped slits 42. When the pattern 40 is illuminated by the effective illumination source 1, the reduced pattern image 43 is formed on a target such as shown in FIG. 11. An effective exposed area 43' (hereinafter briefly called field), for example, is about 20 mm square in case of magnification factor of 5:1 (pattern image is reduced). When the target is moved in the positive or negative Z axis-direction within a depth of focus of the apparatus, the pattern images 44 and 45 are formed on the target, which correspond to fields 44' and 45' respectively. The field 44' is larger than the field 43', and the field 45' is smaller that the field 43' as shown in FIG. 11. This means the magnification changes depending on Z axis positions of the target.

An amount of the magnification off-telecentricity may be defined by a formula $\Delta M/\Delta z$, where $\Delta M$ represents a change of field size divided by the field size, thereby the field size change being measured by changing Z axis position by $\Delta z$. The definition is more clearly understood when FIG. 11 is referred to for explanation. Assuming that a dimension d between two "L"-character shaped patterns in pattern image 43 represents the field size M for the field 43'. When the XYZ stage 4 is moved to position $z+\Delta z$, and the dimension increases to d', then $(d'-d)/d$ denotes $\Delta M$. For example, when the field size M of 20 mm increases to the field size M$\Delta$of 20 mm+0.02µm, a ratio of change is expressed as 0.02µm/20 mm, namely, 1 ppm in this case. If the movement of the XYZ stage in the Z axis-direction, namely, $\Delta z$ is assumed as 5µm, then the $\Delta M/\Delta z$ is expressed as 1ppm/5µm. When normalized by the movement in the Z axis-direction, magnification off-telecentricity amount is 0.002ppm/µm.

Each field size of fields 43', 44' or 45' can be represented by a dimension between two "L"-character shaped patterns aligned in the X or Y axis-direction, therefore, by detecting these two patterns, the field size can be measured in the similar manner. The same detecting and correcting circuitry as disclosed in FIG. 9 can be used for this purpose.

The present invention may be embodied in other specific forms different from the disclosed embodiments. The presently disclosed embodiments are, therefore, to be considered in all respects as illustrative and not restrictive, the scope of the invention being indicated by the appended claims, rather than the foregoing description, and all changes which come within the meaning and range of equivalence of the claims are, therefore, to be embraced therein.

What is claimed is:

1. A photo-lithography apparatus comprising an effective illumination source, a condenser lens, a reticle, a projection lens, and an XYZ stage, these elements being aligned in a Z axis-direction in an XYZ-axes orthogonal coordinate system, wherein a reduced image of pattern on the reticle is formed on a substrate disposed on the XYZ stage, and wherein the effective illumination source comprises an aperture stop which is mechanically changeable depending on an illumination mode, said apparatus further comprising:

photo-detector disposed on said XYZ stage for detecting a specific pattern in said image, the photo-detector being movable in X, Y, and Z axis-directions by a drive mechanism of the XYZ stage, means for moving said effective illumination source in X, Y, and Z axis-directions, and detecting/outputting means for detecting an off-telecentricity amount of said photo-lithography apparatus and outputting adjustment data to said means for moving the effective illumination source, said detecting/outputting means being coupled with said photo-detector, said XYZ stage through said drive mechanism and an interference meter, and said means for moving the effective illumination source, thereby misalignment of said effective illumination source causing said off-telecentricity being corrected.

2. A photo-lithography apparatus as recited in claim 1, wherein said effective illumination source further comprises a lamp source, an input lens and a flyeye lens aligned in this order, and these elements being arranged so to radiate light of uniform intensity onto said reticle.

3. A photo-lithography apparatus as recited in claim 1, wherein said off-telecentricity is substantially caused by a shift of an optical axis of said effective illumination source in X and/or Y axis-directions resulting in shifting the pattern image in X and/or Y axis-directions, which occurs when said aperture stop is changed corresponding to selection of the illumination mode.

4. A photo-lithography apparatus as recited in claim 2, wherein said off-telecentricity is substantially caused by a shift of an optical axis of said effective illumination source in X and/or Y axis-directions resulting in shifting the pattern image in X and/or Y axis-directions, which occurs when said lamp source is changed.

5. A photo-lithography apparatus as recited in claim 1, wherein said off-telecentricity is substantially caused by a shift of said effective illumination source in Z axis-direction resulting in changing a magnification factor of the pattern image, which occurs when conditions of said effective illumination source are changed.

6. A photo-lithography apparatus as recited in claim 1, wherein said detecting/outputting means further comprises an automatic gain controller (AGC), an A/D converter, a memory for storing detected data, a data processing unit, a microprocessor, and central controller, and wherein these elements are operatively connected with each other and coupled to said photo-detector, said interference meter and said drive mechanism for said XYZ stage, and said moving means of the effective illumination source.

7. A photo-lithography apparatus as recited in claim 1, wherein said pattern on the reticle is a linear slit or an "L"-character shaped slit.

8. A photo-lithography apparatus as recited in claim 7, wherein said pattern comprises four "L"-character shaped slits arranged on each corner of an assumed square shape.

9. A photo-lithography apparatus as recited in claim 1, wherein said photo-detector comprises a cover having an opening of a pinhole or a slit so as to detect a precise position of the pattern image.

10. A photo-lithography apparatus as recited in claim 1, wherein said effective illumination source comprises a plurality of aperture stops, opening shapes of which include such as a circular hole, four circular holes arranged symmetrically, and an annular hole, and wherein said plurality of aperture stops are arranged on a disk and one of the aperture stops is selected by rotation of the disk.

11. A method of correcting illumination off-telecentricity of a photo-lithography apparatus comprising an effective illumination source, a condenser lens, a reticle, a projection lens, and an XYZ stage, these elements being aligned in a Z axis-direction in an XYZ-axes orthogonal coordinate system, wherein a reduced image of pattern on the reticle is formed on a substrate disposed on the XYZ stage, and wherein the photo-lithography apparatus further comprises means for moving said effective illumination source, a photo-detector disposed on said XYZ stage, and detecting/outputting means for detecting an off-telecentricity amount and outputting an adjustment data to said means for moving the effective illumination source, said method for correcting off-telecentricity caused by a shift of said effective illumination source in a transversal direction to an optical axis of said apparatus, comprising the steps of:

(a) providing a reticle having a specific pattern formed on the reticle, (b) moving said XYZ stage within depth of focus of said apparatus such that an image of said specific pattern is detected by said photo-detector, and recording coordinates (x, y, z) when detected, (c) moving said XYZ stage in the Z axis-direction within depth of focus of said apparatus, and next moving said XYZ stage in the X and Y axis-directions such that said specific pattern image is again detected by said photo-detector, and recording coordinates (x', y', z') when detected, and (d) detecting said off-telecentricity amount by calculating $(x'-x)/(z'-z)$ and $(y'-y)/(z'-z)$ and outputting said adjustment data corresponding to the off-telecentricity amount to said means for moving the effective illumination source.

12. A method of correcting off-telecentricity of a photo-lithography apparatus as recited in claim 11, wherein said photo-lithography apparatus further comprises an interference meter for outputting position data of said XYZ stage, an automatic gain controller (AGC), an A/D converter, a memory for storing detected data, a data processing unit, a microprocessor, and central controller, and wherein these elements are operatively connected with each other and coupled to said interference meter, said XYZ stage and said photo-detector, and outputs a control signal to said moving means of the effective illumination source so as to compensate said off-telecentricity amount, and wherein said steps (b) through (d) are performed automatically under a command of said central controller.

13. A method of correcting magnification off-telecentricity of a photo-lithography apparatus comprising an effective illumination source, a condenser lens, a reticle, a projection lens, and an XYZ stage, these elements being aligned in a Z axis-direction in an XYZ-axes orthogonal coordinate system, wherein a reduced image of pattern on the reticle is formed on a substrate disposed on the XYZ stage, and the photo-lithography apparatus further comprises means for moving said effective illumination source, a photo-detector disposed on said XYZ stage, and detecting/outputting means for detecting an off-telecentricity amount and outputting an adjustment data to said means for moving the effective illumination source, said method for correcting off-telecentricity caused by a shift or said effective illumination source in an optical axis-direction, comprising the steps of:

(a) providing a reticle having four specific patterns formed at each corner of an assumed square on the reticle such that a field size can be measured by detecting the specific pattern image, (b) moving said XYZ stage within depth of focus of said apparatus such that an image of specific patterns is detected, and next moving said XYZ stage in the X or Y axis-direction such that the field size M is detected by detecting image of two specific patterns aligned in the X or Y axis-direction, and recording coordinate (z) and the field size (M) when said specific pattern images are detected.

(c) moving said XYZ stage in the Z axis-direction within depth of focus of said apparatus, and next moving said XYZ stage in the X or Y axis-direction such that a field size M' is detected as in step (b), and recording coordinate (z') and a field size (M') when said specific pattern images are detected, and (d) detecting said off-telecentricity amount by calculating $\Delta M/(z'-z)$, where $\Delta M$ denotes $(M'-M)/M$, and outputting said adjustment data corresponding to said off-telecentricity amount to said means for moving the effective illumination source.

* * * * *